United States Patent
Kannell et al.

[19]

[11] Patent Number: 6,167,247
[45] Date of Patent: Dec. 26, 2000

[54] LOCAL OSCILLATOR LEAK CANCELLATION CIRCUIT

[75] Inventors: George Kenneth Kannell, Florham Park; Robert Evan Myer, Denville; Krishnamurthy Sreenath, Randolph, all of N.J.

[73] Assignee: Lucent Technologies, Inc., Murray Hill, N.J.

[21] Appl. No.: 09/115,656

[22] Filed: Jul. 15, 1998

[51] Int. Cl.$^7$ ...................................................... H04B 1/10
[52] U.S. Cl. ............................ 455/317; 455/296; 455/295
[58] Field of Search .................................... 455/202, 210, 455/211, 212, 295, 296, 115, 126, 117, 118, 119, 310, 317, 318, 324, 127, 255, 313, 314

[56] References Cited

U.S. PATENT DOCUMENTS

| | | | |
|---|---|---|---|
| 4,410,764 | 10/1983 | Werth et al. | 364/513 |
| 5,381,108 | 1/1995 | Whitmarsh et al. | 330/2 |
| 5,469,105 | 11/1995 | Sparks | 330/129 |
| 5,517,684 | 5/1996 | Fujita et al. | 455/234.2 |
| 5,628,059 | 5/1997 | Kurisu | 455/126 |
| 5,918,167 | 6/1999 | Tiller et al. | 455/310 |
| 5,959,499 | 9/1999 | Khan et al. | 330/149 |

FOREIGN PATENT DOCUMENTS 2213006  2/1989  United Kingdom ........................... 1/6

*Primary Examiner*—Reinhard J. Eisenzopf
*Assistant Examiner*—Naghmeh Mehrpour
*Attorney, Agent, or Firm*—Mayer, Fortkort & Williams; Karin L. Williams

[57] ABSTRACT

A method for reducing the level of an undesired signal, generated through a frequency converter device, by implementing a local oscillator (hereinafter "LO") leak cancellation circuit. A feedback correction loop, for a radio frequency (RF) transmitter or receiver, reduces an undesired local oscillator leak generated through a single input frequency converter device, such as a mixer, by a unique detection circuit. A unique nulling circuit is also implemented for a multiple input frequency converter device, such as a quadrature modulator.

5 Claims, 4 Drawing Sheets

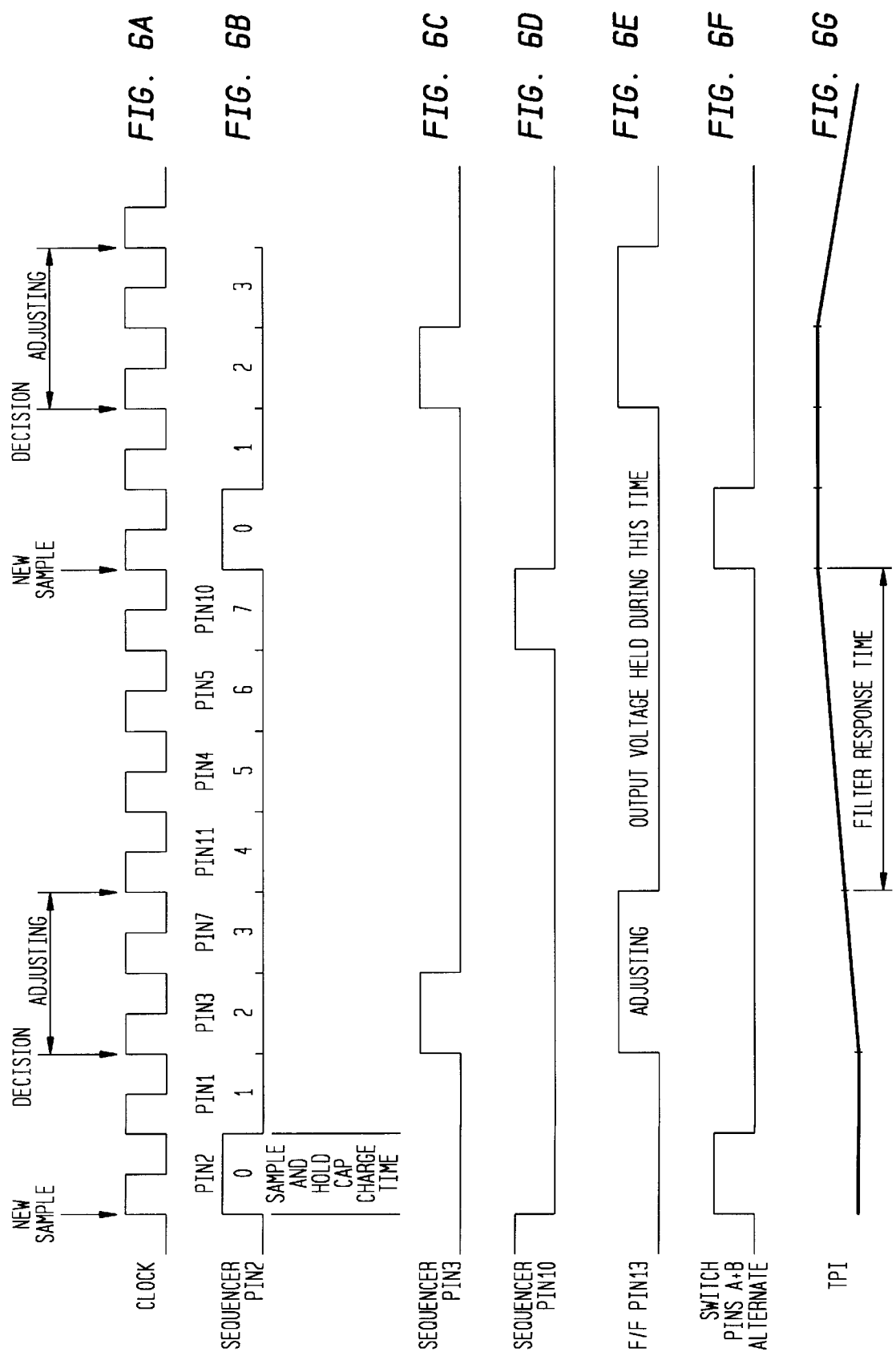

LOCAL OSCILLATOR LEAK CANCELLATION CIRCUIT

BACKGROUND OF THE INVENTION

The present invention relates generally to a method for reducing the level of an undesired signal, generated through frequency converter devices, by implementing a local oscillator (hereinafter "LO") leak cancellation circuit. More particularly, the present invention relates to a novel feedback correction loop, for a radio frequency (RF) transmitter or receiver, to reduce an undesired local oscillator leak generated through an RF frequency converter device, such as a mixer or modulator.

There is an accelerating demand for highly integrated radio frequency transmitter and receiver designs, lower cost, increased accuracy, greater dynamic range, etc. A radio frequency transmitter modulates the information to be communicated onto a carrier, amplifies the signal to the desired power level and delivers it to the transmitting antenna. A radio-frequency oscillator's signal is modulated by the message signal so as to shift the frequency from a baseband (BB) or intermediate frequency (IF) to the desired RF frequency prior to transmission. RF transmitters offer a unique combination of high output power, low distortion and programmable gain to satisfy the requirements of the upstream communications link in broadband access terminals.

However, RF transmitters typically suffer from unwanted signal transmission. As noted above, a local oscillator (LO) is used in conjunction with a frequency converter device, i.e., a frequency modulator or mixer, to translate the signal spectrum to an alternate band (BB or IF to RF). One common undesired signal generated in a RF transmitter, the Local Oscillator leak (LO leak) signal, is generated through the RF frequency converter devices. Typically, it is not necessary to reduce the level of these undesired signals, as the rejection of the carrier signal of 30–40 dB for example, is usually acceptable for most applications. However, in an application that requires a better than 30–40 dB carrier rejection, a method of adjusting the DC balance in the mixer or modulator, so as to correct for the LO leak and improve the carrier rejection, must be devised.

The present invention is therefore directed to the problem of developing a LO leak cancellation circuit and a method for reducing the level of undesired signal transmission.

SUMMARY OF THE INVENTION

The present invention solves these problems by providing a local oscillator leak cancellation circuit having novel means for detecting the level of a local oscillator leak signal generated through a first frequency converter and producing a detector output proportional to the detected level. In an embodiment where the frequency converter is a mixer having one input port, the error voltage from the detector is input directly to the mixer.

In another embodiment of the present invention, if the frequency converter has more than one DC-coupled input port, e.g., a quadrature modulator, a correction circuit generates a correction signal based on the detector output, and provides the correction signal to the frequency converter.

A preferred embodiment of the detection circuit specifically includes means for amplifying an input composite signal from the first frequency converter, means for converting a frequency of a signal output from said amplifier means and means for filtering a signal output from the second frequency converting means.

A preferred embodiment of the correction circuit includes means for comparing samples of the detector outputs and means for alternately adjusting DC voltage outputs of the correction circuit for generating the correction signal.

BRIEF DESCRIPTION OF THE DRAWINGS

The above-mentioned and other objects, features and advantages of the present invention will become more apparent from the following detailed description when taken in conjunction with the accompanying drawings, wherein:

FIG. 6 is a timing diagram for the detailed schematic of the nulling circuit illustrated in FIG. 5.

DETAILED DESCRIPTION

A radio-frequency transmitter typically uses a frequency converter device (i.e., a mixer or modulator), together with a local oscillator, to translate the signal spectrum to the RF band (BB or IF to RF). A frequency converter device simply translates a band of frequencies, centering at a certain frequency, to a band of similar frequencies, centering at another frequency. The input information signal and the local oscillator signal are simultaneously applied to the frequency converter device. The local oscillator signal is then modulated either up or down to convert the information signal to a different frequency. In a transmitter, the information signal is typically up-converted to a RF frequency. Specifically, the RF signal is introduced using one transformer and the LO signal is introduced using the other transformer in a frequency converter device. A conventional transmitter or receiver may use any known mixer or modulator to accomplish the frequency translation.

In a conventional RF transmitter or receiver, an undesired signal is generated through a frequency converter device. Specifically, a Local Oscillator leak (LO leak) signal, is generated through the RF frequency converter device. Together with the up-converted signal, the output of the frequency converter (mixer or modulator) contains the local oscillator leak signal that contains no information and interferes with transmission. The local oscillator leak thus degrades the signal quality and hence the performance of the transmitter. However, a conventional RF transmitter does not include any means for reducing the level of an undesired LO leak signal after the LO signal is input to a mixer or modulator. In some cases, the LO signal can be reduced using filtering; however, this is not always the best solution.

The present invention takes into account that the LO leak signal can be adjusted by applying a dc level to the frequency converter's dc-coupled low frequency port(s). Specifically, as illustrated in FIG. 1, in accordance with the present invention, a frequency converter device 20 (i.e., a mixer or modulator) receives an input IF information signal.

Figure 1:
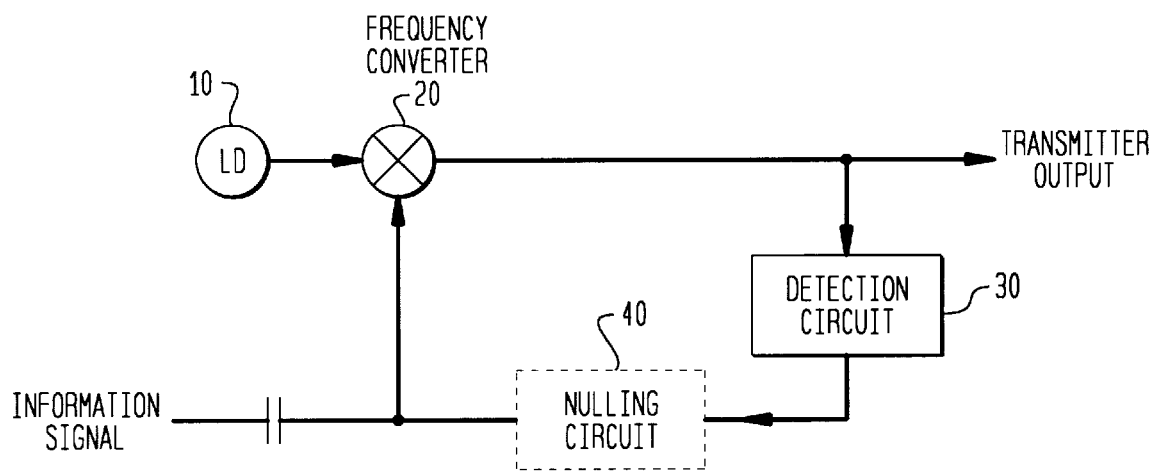
FIG. 1 is a block diagram showing a LO leak cancellation circuit, of a RF transmitter, in accordance with the principles of the present invention.

A local oscillator signal from local oscillator 10 is simultaneously applied to frequency converter device 20 (although the local oscillator 10 and frequency converter are illustrated as separate devices in FIG. 1, it will be appreciated that various IC's include both a mixer and a local oscillator and are not outside the scope of the invention). The composite signal output from frequency converter device 20 is input to detection circuit 30 which generates an error voltage proportional to the level of the undesired signal. Nulling circuit 40, indicated in dashed lines in FIG. 1, is implemented into the invention only if frequency converter device 20 calls for such implementation (e.g., if frequency converter 20 is a frequency converter with more than one DC-coupled IF or BB input port, such as a quadrature modulator). However, if frequency converter device 20 is a mixer, which requires only one input voltage, the error voltage from the detection circuit 30 is input directly to the mixer. In this case, using negative feedback, the detection circuit's output voltage controls the voltage at the mixer's DC coupled input port without the nulling circuit.

One embodiment of the present invention implements a conventional diode ring mixer as frequency converter device 20, typically consisting of two transistors and a diode ring. The ideal output of the mixer is the sum and difference of the input frequency and the local oscillator frequency. However, the modulation of the local oscillator signal by the information signal is never perfect in the mixer, but again, it can be made closer by adjusting the DC offset that enters the diode ring. However, a number of variables, including temperature variations, will cause the adjustment to drift, again creating an undesired local oscillator signal to be generated through the frequency converter device. The exact level required is variable with time and not consistent. Thus, a circuit was required which would allow the control to be automatic.

Figure 2:
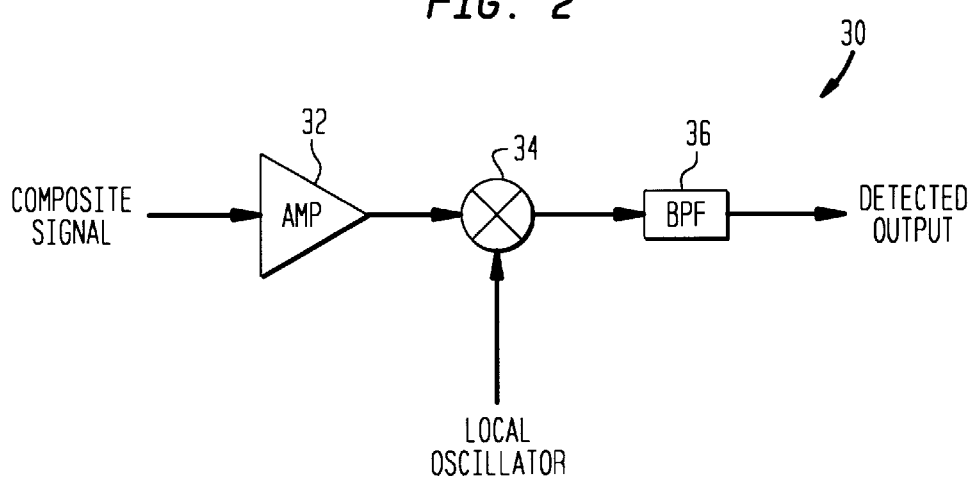
FIG. 2 is a block diagram showing the basic components of a detection circuit, shown in the FIG. 1 LO leak cancellation circuit, in accordance with the principles of the present invention.

A detailed block diagram of detection circuit 30 is shown in FIG. 2. The "detection circuit" provides an output that is proportional only to the level of an input RF signal (in this case, the detected LO signal). One of the features that makes detection circuit 30 unique is its ability to extract information on the level of the signal when there is a "modulated spread" carrier or other information signals in the same frequency space.

Figure 4:
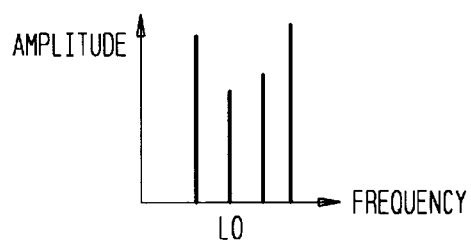
FIG. 4 is an illustration of an example of a composite signal input to the detection circuit.

An example of the composite "modulated spread" signal output from frequency converter device 20 in FIG. 1 is illustrated in FIG. 4. The composite signal output from the mixer and received as an input to the detection circuit shows a mixer spectrum with several tones. It is desired to reduce only the level of the "LO" signal as shown, as the LO signal does not carry information. The other three example signals shown are information carrying signals and thus are unaffected by the LO leak cancellation loop described herein. The detection circuit detects the LO signal's level as a DC voltage and the nulling circuit provides control signals to keep the LO level as low as possible.

There are two techniques required to achieve the function of extracting information on the level of the signal when there is a modulated spread carrier in the same frequency space—the first technique is to provide a detector that is sensitive to amplitude. Traditional detection schemes using mixer (or product detector) down-converters have sinusoidal outputs that are sensitive to both amplitude and phase. In that case, it is difficult to distinguish the phase from the amplitude sensitivity.

As shown in FIG. 2, the composite signal is input to an amplifier 32, and the output of the amplifier is input to a quadrature demodulator 34. In one embodiment, the quadrature demodulator's sine and cosine voltage outputs may be squared with multipliers then added to minimize the phase sensitivity. Specifically, when the circuit uses a multiplier at the output, it theoretically provides the best amplitude detection since it removes the phase information (i.e., by squaring and summing the sine and cosine to form the well-known equation, $sine^2+cos^2$ equal to 1). However, multipliers typically have a problem wherein DC offset levels at their ports cause errors in this type of application. Since the DC level is used as a measure of the LO level, any DC offset results in significant error.

Figure 3:
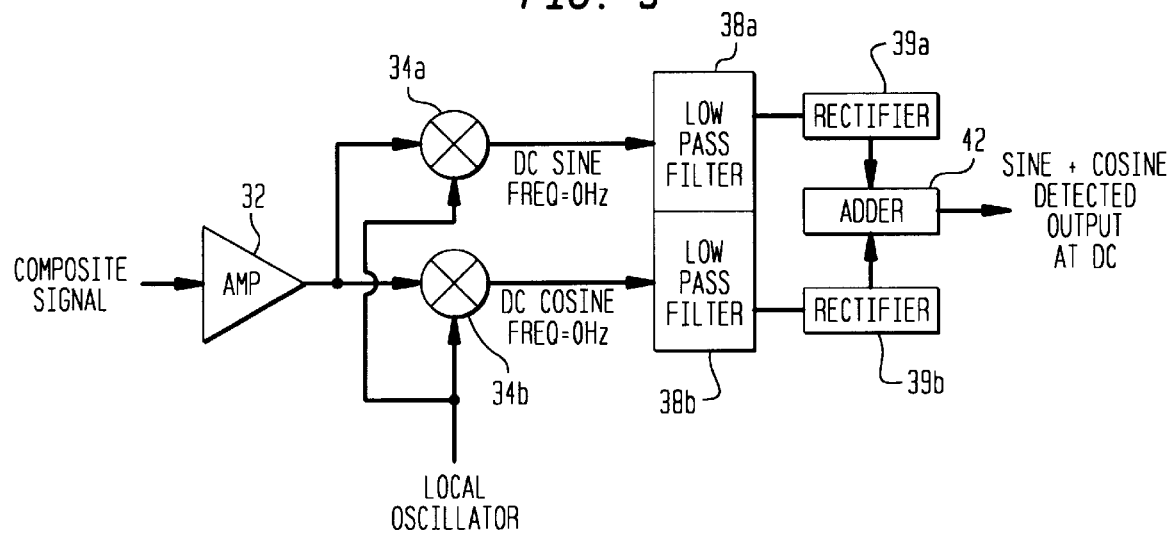
FIG. 3 is a more detailed diagram of the detection circuit shown in the FIG. 1 LO leak cancellation circuit.

Thus, a preferred embodiment of the invention, as illustrated in FIG. 3 described in more detail below, adds and takes the absolute value of the sine and cosine voltage outputs.

A second technique required to extract information on the level of the signal when there is a modulated spread carrier in the same frequency space is to detect the desired signal in the presence of a stronger spread signal or noise. In this design, as shown in FIG. 2, the composite signal is first down-converted by quadrature down-converter 34 and is then filtered by BPF 36 to reduce the undesired signals; in FIG. 3, the composite signal is down-converted by quadrature demodulator 34 (34a and 34b) and is then filtered by low pass filter 38 (38a and 38b). It is desirable to use coherent LO's for the frequency converter device and the detection circuit. A detection circuit in accordance with the present invention, including the detection circuit shown in FIG. 2 (and the more detailed circuit shown in FIG. 3) has filters, after the LO's down-conversion, which remove the other signals, allowing only the LO information to be passed through.

A more detailed illustration of a preferred embodiment of the detection circuit is shown in FIG. 3. Based on the problems described above in using a multiplier in the detection circuit, a preferred embodiment of the circuit was designed with an "adder" (summing) circuit shown in FIG. 3. This embodiment adds the sine and cosine outputs, without squaring the outputs, and thus results in detection error. In this particular embodiment, the adding circuit performs better than the multiplier circuit with regard to error and also has a lower cost than the multiplier circuit.

It will be appreciated by those skilled in the art that a problem in the invention may arise from the down-converter operating at DC (or 0 Hz). Since the preferred embodiment of the detection circuit shown in FIG. 3 relies on the DC output level of the down-converter (quadrature demodulator 34), any DC offset in the down-converter will cause an error in the level detection capability. However, adding an extra signal into the down-converter mixer (or modulator) can avoid this problem. Specifically, the extra signal's output level is proportional to the LO leak level; however, it's frequency is greater than DC and thus this section of the circuit avoids DC.

It should be noted that if the frequency converter device 20 of FIG. 1 is a mixer, the output of the detection circuit 30 indicating the "error voltage" is provided directly to the IF port of the mixer from the detection circuit, as the "nulling circuit" 40 shown in dashed lines in FIG. 1 is unnecessary.

If however, the frequency converter device 20 is a modulator, for example, a quadrature modulator, a nulling circuit is necessary to provide two separate DC inputs to the modulator. Specifically, the detection circuit supplies the LO level to the nulling circuit as a dc level. The higher the LO level, the higher the DC level. The nulling circuit varies its two outputs to reduce the DC voltage at its input. In the case of the quadrature modulator, there are two DC inputs and thus the nulling circuit adjusts the dc level on each of its two outputs.

The nulling circuit 40 receives the error voltage generated as described above in the detection circuit 30 and provides a DC correction voltage to the I and Q ports of the modulator. Various techniques may be used to implement nulling circuit 40, including the circuit shown in FIG. 5. In that figure, samples of the input voltage are compared in a time sequence to determine if the input voltage is increasing or decreasing. Based on that determination, the two DC voltage outputs are alternatively adjusted to achieve a minimum voltage at the input, i.e., a "null".

Figure 5:
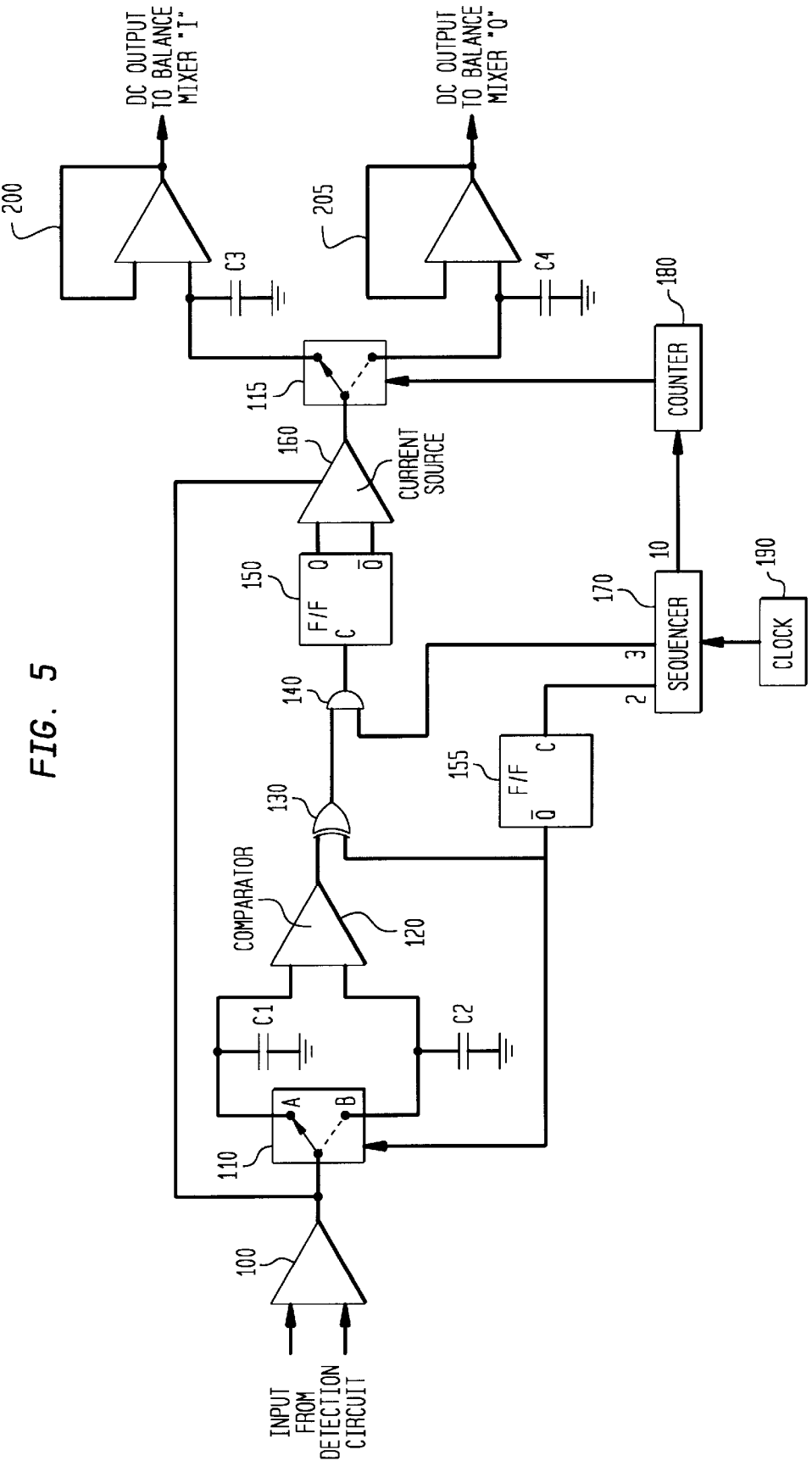
FIG. 5 is a detailed schematic of the nulling circuit 40, shown in the block diagram of the FIG. 1 LO leak cancellation circuit.

More specifically, as shown in FIG. 5, the output from the detection circuit is input to an amplifier 100. A switch 110 receives the output of amp 100 and alternates its output between two output pins A and B so as to charge capacitors C1 and C2, respectively, based on a sample and hold capacitor charge time from flip-flop 155. Clock 190 and sequencer 170 operate to provide the timing required by switch 110 and AND gate 140, as discussed further below.

Comparator 120 receives the signals from switch 110 and together with exclusive OR gate 130, AND gate 140, flip-flop 150, and current source 160, provide an indication to output switch 115 to alternatively adjust the DC voltage output based on capacitors C3 and C4, between output pins A and B of switch 115 respectively, to be input to the balance mixer "I" and the balance mixer "Q" to achieve the minimum voltage at the input. Counter 180 operates in conjunction with sequencer 170 and switch 115 so as to provide the correct timing for the switching adjustment voltage output.

The timing diagram of FIG. 6 even further describes and clarifies the operations described above with respect to the FIG. 5 nulling circuit. Specifically, an output of clock 190 is illustrated in signal 6(*a*) and is provided to sequencer 170. Various timing signals are then output from sequencer 170 as illustrated in signals 6(*b*), 6(*c*) and 6(*d*), which provide, respectively, a clock input to flip-flop 155, an input to and gate 140 and an input to counter 180.

Signal 6(*e*) illustrates the timing of a signal output from flip-flops 150 and 155 and signal 6(*f*) indicates a signal output from switch 110 and 115 (which may be a "quad switch") and which alternates between the two output pins of that switch. Finally, the "filter response time" is illustrated in FIG. 6(*g*), and as the timing illustrates, this period of time is actually the time period from the end of the "adjusting period" where the flip-flops are "on" and the time at which current source 160 provides an adjustment voltage to the respective capacitor C3 or C4 through switch 115.

Although various embodiments are specifically illustrated and described herein, it will be appreciated that modifications and variations of the present invention are covered by the above teachings and within the purview of the appended claims without departing from the spirit and intended scope of the invention.

What is claimed is:

1. A local oscillator leak cancellation circuit, comprising:
    detector means for detecting a level of a local oscillator leak signal generated through a first frequency converter and producing a detector output proportional to the detected level, wherein said detector means further comprises:
       amplifier means for amplifying an input composite signal from the first frequency converter;
       second frequency converting means for converting a frequency of a signal output from said amplifier means; and
       filtering means for filtering a signal output from said frequency converting means,
    wherein two outputs from said second frequency converting means, a DC sine output and a DC cosine output, are input to said filtering means which comprises low pass filters.

2. A circuit according to claim 1, wherein two outputs from the low pass filters are input to rectifiers and are then added to produce a DC detected output.

3. A circuit according to claim 1, wherein two outputs from the low pass filters are input to rectifiers and are then added to produce a DC detected output.

4. A local oscillator leak cancellation circuit, comprising:
    detector means for detecting a level of a local oscillator leak signal generated through a first frequency converter and producing a detector output proportional to the detected level, wherein the first frequency converter has more than one DC-coupled input port; and
    correction signal generating means for generating a correction signal based on the detector output, and providing the correction signal to the first frequency converter,
    wherein said correction signal generating means farther comprises:
       comparing means for comparing samples of the detector outputs; and
       adjusting means for alternately adjusting DC voltage outputs of said correction signal generating means for generating the correction signal.

5. A feedback correction loop for reducing the transmission of undesired signals, generated through a frequency converter device having more than one DC coupled input port, comprising:
    detector means for detecting a level of an undesired signal generated through the frequency converter device and producing a detector output proportional to the detected level; and
    correction signal generating means for generating a correction signal based on the detector output, and providing the correction signal to the frequency converter device,
    wherein said detector means further comprises:
       amplifier means for amplifying an input composite signal from the first frequency converter;
       second frequency converting means for converting a frequency of a signal output from said amplifier means; and
       filtering means for filtering a signal output from said second frequency converting means, and
    wherein said correction signal generating means further comprises:
       comparing means for comparing samples of the detector outputs; and
       adjusting means for alternately adjusting DC voltage outputs of said correction signal generating means for generating the correction signal.

* * * * *

UNITED STATES PATENT AND TRADEMARK OFFICE
CERTIFICATE OF CORRECTION

PATENT NO. : 6,167,247
DATED : December 26, 2000
INVENTOR(S) : Kannell et al.

It is certified that error appears in the above-identified patent and that said Letters Patent are hereby corrected as shown below:

Claim 1, Column 6, line 8, before "frequency", insert --- second ---.

Claim 4, Column 6, line 31, change "farther" to --- further ---.

Signed and Sealed this

Twenty-ninth Day of May, 2001

Attest:

NICHOLAS P. GODICI

Attesting Officer    Acting Director of the United States Patent and Trademark Office